United States Patent
Nogami et al.

(10) Patent No.: US 10,529,663 B1
(45) Date of Patent: Jan. 7, 2020

(54) COPPER INTERCONNECT WITH FILLED VOID

(71) Applicant: International Business Machines Corporation, Armonk, NY (US)

(72) Inventors: Takeshi Nogami, Schenectady, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/159,671

(22) Filed: Oct. 14, 2018

(51) Int. Cl.
*H01L 21/4763* (2006.01)
*H01L 23/532* (2006.01)
*H01L 21/768* (2006.01)

(52) U.S. Cl.
CPC .. *H01L 23/53238* (2013.01); *H01L 21/76843* (2013.01); *H01L 21/76877* (2013.01)

(58) Field of Classification Search
CPC ......... H01L 23/53238; H01L 21/76843; H01L 21/7684; H01L 21/7685; H01L 21/76877
USPC ....... 438/622, 637, 638, 639, 645, 672, 687; 257/758, 762
See application file for complete search history.

(56) References Cited

U.S. PATENT DOCUMENTS

| | | | |
|---|---|---|---|
| 7,338,908 B1 | 3/2008 | Koos et al. | |
| 7,666,787 B2 | 2/2010 | Yang et al. | |
| 7,732,922 B2 | 6/2010 | Yang et al. | |
| 7,843,063 B2 | 11/2010 | Baker-O'Neal et al. | |
| 7,956,466 B2 | 6/2011 | Hsu et al. | |
| 9,190,323 B2* | 11/2015 | Zhang | H01L 23/53238 |
| 9,754,883 B1* | 9/2017 | Briggs | H01L 21/7685 |
| 9,754,885 B1* | 9/2017 | Briggs | H01L 21/7685 |
| 9,786,550 B2 | 10/2017 | Gates et al. | |
| 9,793,156 B1 | 10/2017 | Yang | |
| 9,799,605 B2 | 10/2017 | Edelstein et al. | |
| 10,276,435 B2* | 4/2019 | Edelstein | H01L 23/53238 |
| 2009/0206484 A1* | 8/2009 | Baker-O'Neal | H01L 21/76873 257/751 |
| 2013/0062769 A1* | 3/2013 | Cabral, Jr. | H01L 23/53238 257/751 |
| 2016/0133573 A1 | 5/2016 | He et al. | |
| 2018/0082845 A1 | 3/2018 | Adusumilli et al. | |

* cited by examiner

*Primary Examiner* — S. V. Clark
(74) *Attorney, Agent, or Firm* — Vazken Alexanian; Otterstedt, Wallace & Kammer, LLP (57) ABSTRACT

Voids within metal deposited on interconnect structures are filled with cobalt or a cobalt compound to enhance electromigration performance. A reflow process to enlarge interconnect metal grain size is performed prior to filling the voids. An interconnect metal microstructure beneath the filled voids includes grain boundaries extending to the bottom portions of the voids. A coating of manganese atoms provides resistance to electromigration. Copper interconnects having fine dimensions and improved reliability are obtained.

20 Claims, 4 Drawing Sheets

COPPER INTERCONNECT WITH FILLED VOID

BACKGROUND

The present application relates generally to the electrical, electronic and computer arts and, more particularly, to metal interconnect structures and their fabrication.

With shrinking dimensions of various integrated circuit components, transistors such as FETs have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

Silicon-based devices typically include multiple interconnect metallization layers above a device (front-end-of-line/ FEOL) layer that contains field-effect transistors (FETs), memory devices, or other structures. Middle-of-line (MOL) processing includes steps typically used for fabricating metal contacts for logic circuitry components such as field-effect transistors (FETs), resistors, diodes, and capacitors. Back-end-of-line (BEOL) processing involves the creation of metal interconnecting wires that connect the devices formed in FEOL processing to form electrical circuits. The interconnecting wires are electrically isolated by dielectric layers. BEOL process technologies may employ copper to form BEOL interconnects. Copper interconnects are characterized by relatively low electrical resistance in the BEOL interconnect structures, resulting in improved conduction and higher performance. Defects in copper interconnect structures such as voids, recesses and/or under-fill can result in loss of line yield, circuit failures, and wafer scrap. Attempts to address such defects have included the stripping of all layers, including interconnect metal and dielectric layers, and redepositing and patterning the same. Patterning steps can become challenging at advanced nodes.

To mitigate electromigration in BEOL copper interconnect structures, a capping layer is typically formed over the BEOL copper wiring. The capping layer is formed with a material that serves to inhibit diffusion, oxidation, and/or electromigration from the top surface of the copper interconnect structures and/or to prevent oxidation of the copper interconnect structures.

A BEOL structure typically includes a dielectric layer and a metal interconnect structure embedded in the dielectric layer. The dielectric layer, which may include multiple layers, may be referred to as an inter-layer dielectric layer or ILD layer. Trench openings are conventionally formed in the ILD layer by using, for example, known damascene techniques. Photolithography and etching steps follow ILD layer deposition. Specifically, a photoresist is applied over the ILD layer. The photoresist can be applied by any suitable technique, including, but not limited to coating or spin-on techniques. A mask (not shown), which is patterned with shapes defining trench openings (and possibly contact holes) to be formed, is provided over the photoresist, and the mask pattern is transferred to the photoresist using a photolithographic process, which creates recesses in the uncovered regions of the photoresist. The patterned photoresist is subsequently used to create the same pattern of recesses in the ILD dielectric layer through conventional etching typically used for forming trenches and contact holes. A dry etch (for example, a reactive ion etch) may be employed to form such trenches and contact holes. The etching selectively removes a portion of the ILD layer. The depth(s) of the trench openings can be controlled by using a timed etching process. Alternatively, the dielectric layer may include multiple layers that may be selectively etched. In such a case, the etch process selectively removes the upper layer(s) of the ILD layer, stopping at a lower layer thereof that forms an etch stop. After formation of the trench openings, the photoresist may be stripped by ashing or other suitable process from the ILD layer.

A further stage in the fabrication process includes depositing a conformal layer of liner material. The conformal layer of liner material lines the sidewall and bottom surfaces of the trenches or other openings within the ILD layer. The liner material may include one or more thin layers of material such as, for example, tantalum (Ta), tantalum nitride (TaN), titanium nitride (TiN), cobalt (Co), tungsten (W), tungsten nitride (WN), titanium-tungsten (TiW), tungsten nitride (WN) manganese (Mn), manganese nitride (MnN) or other liner materials (or combinations of liner materials) such as RuTaN, Ta/TaN, CoWP, NiMoP, NiMoB) which are suitable for the given application. The thin liner serves as a barrier diffusion layer and adhesion layer. The conformal layer of liner material is deposited using known techniques such as CVD, ALD, or PVD. A thin conformal Cu seed layer can be deposited over the surface of the liner using PVD, followed by the electroplating of Cu to fill the damascene (or dual damascene) openings in the ILD layer. A thermal anneal stage follows electroplating.

The overburden liner, seed, and metallization materials are then removed by performing a three step chemical mechanical polishing process (CMP) to planarize the surface of the semiconductor structure down to the ILD layer. A metal cap layer is selectively deposited on the exposed metal interconnect layer within the trenches. For example, metals such as cobalt, ruthenium or manganese may be deposited using chemical vapor deposition or atomic layer deposition to form the cap layers. Post-deposition cleaning may be required to ensure there is no leakage or degradation resulting from possible metal residues on the resulting structure. Cleaning and/or other steps that may be performed subsequent to capping.

BRIEF SUMMARY

Techniques are provided for fabricating interconnect metallization structures to address potential problems relating to voids and electromigration in BEOL metal interconnects.

In one aspect, an exemplary method of fabricating an interconnect structure includes obtaining an initial structure comprising a dielectric layer, a plurality of open-ended trenches extending downwardly within the dielectric layer, each of the open-ended trenches having a bottom surface and opposing sidewalls, and a metal interconnect layer comprising copper. The metal interconnect layer fills the open-ended trenches and includes buried voids therein. The metal interconnect layer further includes bottom regions beneath the buried voids, the bottom regions including bamboo microstructures comprising grain boundaries extending from the bottom surfaces of the open-ended trenches to the buried voids. The metal interconnect layer is planarized, thereby exposing a top surface of the dielectric layer and opening the buried voids to form opened voids.

The opened voids are filled with an electrically conductive filler layer, the electrically conductive filler layer comprising a copper diffusion barrier.

In another aspect, an interconnect structure is provided that includes a dielectric layer having a top surface, an open-ended trench extending within the dielectric layer and downwardly with respect to the top surface, the trench being bounded by opposing sidewalls and a bottom surface, a metal interconnect comprising copper within the trench, and a liner comprising a diffusion barrier layer between the metal interconnect and the dielectric layer. A void extends within the metal interconnect and has a top opening. An electrically conductive filler layer fills the void and comprises a copper diffusion barrier. The metal interconnect further includes a bottom region between the void and the bottom surface of the trench and vertically extending regions. The bottom region includes a bamboo microstructure comprising grain boundaries extending from the liner to the void. The vertically extending regions are between the opposing sidewalls of the trench and the void. The bottom region and the vertically extending regions completely separate the void from the liner.

One or more embodiments or elements thereof can be implemented in the form of a computer program product including a computer readable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques as disclosed herein can provide substantial beneficial technical effects. By way of example only and without limitation, one or more embodiments may provide one or more of the following advantages:

Improved electromigration reliability;
Improved line yield/less wafer scrap;
Bamboo copper grain structure obtained.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present inventions will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1:
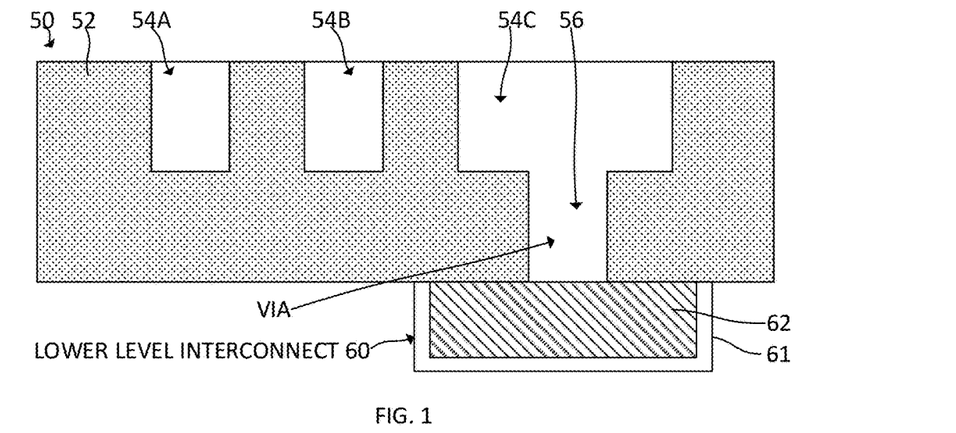
FIG. 1 is a schematic, cross-sectional view showing trenches and a via formed in a dielectric layer above a lower level interconnect structure.

Referring to FIG. 1, a BEOL interconnect structure 50 includes a dielectric layer 52 having trenches 54A, 54B and 54C formed therein. Trench widths may, for example, be between 24 nm and 10 µm. Trench depths can be between 24 nm and 10 µm. Such dimensions should be considered exemplary as opposed to limiting. The techniques disclose herein allow relatively high electromigration performance of, for example, copper interconnects having relatively fine dimensions such as line widths of five nanometers to twenty nanometers (5-20 nm). The opposing sidewalls of the trenches extend vertically downwardly from the top surface of the dielectric layer. The trench sidewalls may or may not be parallel to each other. The structure 50 further includes a lower level interconnect structure 60 including an electrically conductive metal layer 62 within a barrier layer 61. A via 56 extends between one of the trenches 54C and the electrically conductive layer 62.

The interlevel dielectric (ILD) layer 52 may be deposited using methods well known in the art. The dielectric (ILD) layer surrounds and electrically insulates interconnect wiring that is formed later in the process. The ILD layer may contain any suitable dielectric material(s) including but not limited to: silicon dioxide, silicon nitride, other types of silicon-based, low-k dielectrics (e.g., k less than about 4.0), porous dielectrics, or known ULK (ultra-low-k) dielectric materials (with k less than about 2.5). The ILD layer may be deposited using known deposition techniques, such as, for example, ALD (atomic layer deposition), CVD (chemical vapor deposition), PECVD (plasma-enhanced CVD), PVD (physical vapor deposition), or spin-on deposition. SiLK® thermosetting polymer may, for example, be applied by spin coating and is planarized following curing. Chemical vapor deposition (CVD), including plasma-enhanced CVD, is a further technique often used for the deposition of low-k dielectric materials such as porous siliconoxycarbonitride (SiOCN). Low-k organic polymers having dielectric constants below 2.5 may alternatively be employed to form the dielectric layer. Low-k ILDs are known to the art for use with copper and copper compound interconnects. The process disclosed herein may alternatively include ILD material having a dielectric constant that is greater than 2.5 for some nodes. The chosen dielectric material is resistant to subsequent selective etching of cap metal and chemical mechanical planarization (CMP), as described below. The ILD layer has a thickness suitable for the specific application requirements. In some embodiments, ILD layer thickness is between thirty and two hundred nanometers (30-200 nm). Such a range should be considered exemplary and not limiting.

The ILD layer 52 may be patterned and subjected to dry etching to obtain the open trenches 54A, 54B, 54C. Conventional lithography and etching processes may be employed to pattern the structure, it being appreciated that such processes continue to be developed in the industry and that etching processes developed in the future may have application to the techniques disclosed herein. A wet cleaning step may follow dry etching.

Figure 2:
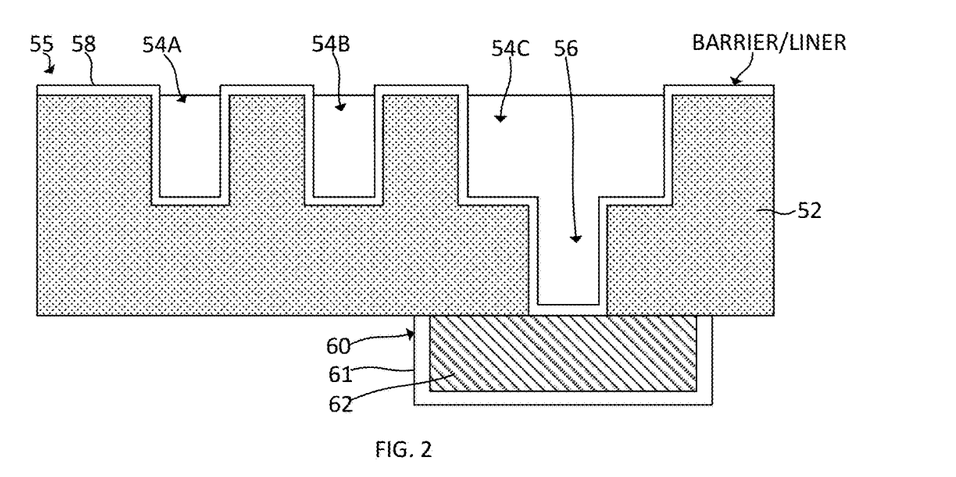
FIG. 2 is a schematic, cross-sectional view showing the structure of FIG. 1 following deposition of a barrier liner.

A liner 58 including a diffusion barrier layer and an adhesion layer is deposited on the resulting structure to obtain a structure 55 as schematically illustrated in FIG. 2. The diffusion barrier layer includes multiple layers in some embodiments and may or may not comprise the same material(s) as the liner 61. In one exemplary embodiment, a tantalum (Ta) or tantalum nitride (TaN) liner is conformally deposited on the structure for use as a diffusion barrier. The diffusion barrier may have a thickness of about ten to sixty Angstroms (10-60Å). A relatively thick diffusion barrier may be employed for interconnect metals such as copper. The diffusion barrier layer can be deposited using any suitable deposition process, for example, atomic layer deposition or sputtering. Ruthenium tantalum nitride (RuTaN) barrier layers deposited using sputtering or other suitable techniques may be employed in embodiments wherein copper is reflowed. A layer of cobalt (Co) is deposited on the barrier liner and functions as the adhesion layer in some embodiments (e.g. TaN/Co barrier/liner). Such material may be deposited using physical vapor deposition or chemical vapor deposition. Radio-frequency enhanced physical vapor deposition (RF PVD) is a known technique for depositing thin metal films, and may be employed for depositing the diffusion barrier and adhesion layers. The barrier/adhesion liner 58 covers the exposed surfaces of the trenches 54A, 54B, 54C, the via 56, the dielectric layer 52 and the exposed top surface of the lower level interconnect 60, as shown in FIG. 2. The bottom and sidewall surfaces of the trenches comprise liner material following deposition of the liner 58.

Figure 3:
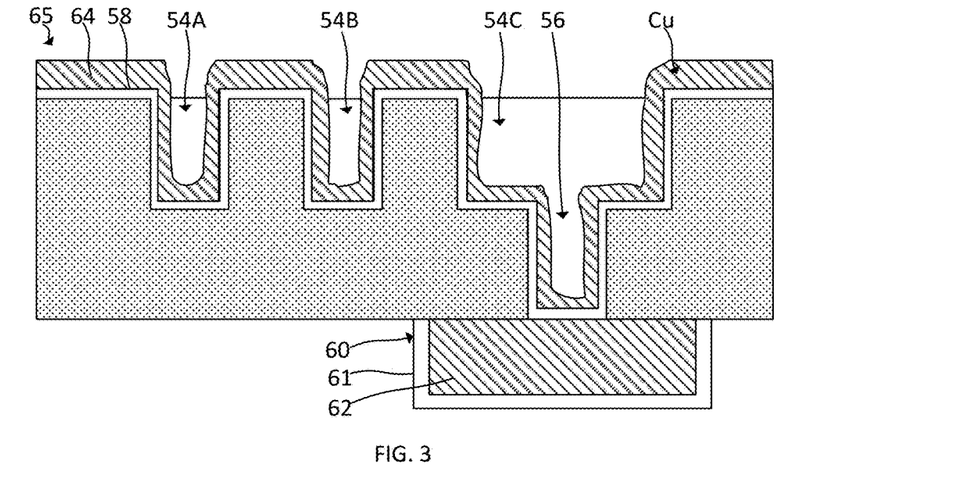
FIG. 3 is a schematic, cross-sectional view of the structure shown in FIG. 2 following the deposition of copper.
Figure 4:
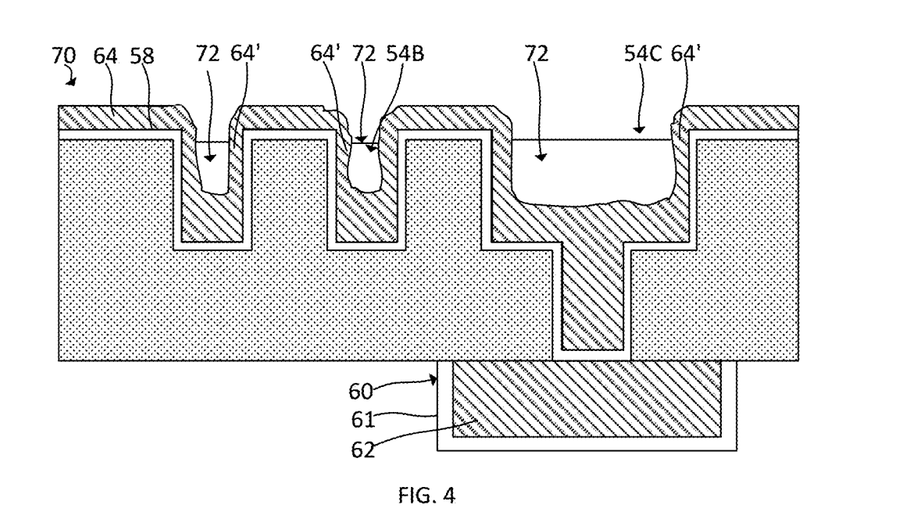
FIG. 4 is a schematic, cross-sectional view thereof following thermal processing to cause reflow of the copper.

In embodiments wherein the interconnect metal is copper, a copper or copper manganese (CuMn) seed layer (not shown) may be deposited on the adhesion layer. A copper manganese seed layer deposited using physical vapor deposition provides resistance to electromigration, as discussed further below. Referring to the structure 65 shown in FIG. 3, a metal interconnect layer 64 partially fills the trenches and the via(s) and extends over the top surface of the dielectric layer 52. Metal interconnect material is deposited using a physical vapor deposition (PVD) technique on the structure and directly contacts the seed layer. Sputtering is employed in some embodiments. The resulting metal layer includes copper (Cu), and consists essentially of elemental copper in some embodiments. Copper alloys such as Cu(Al) and CuMn may alternatively be employed as metal interconnect layer material. Voids will be formed within the interconnect metal in the trenches 54A, 54B, 54C upon reflow thereof, as described below. The barrier layer deposited prior to the copper fill helps prevent the diffusion of interconnect metal into the surrounding dielectric material. The interconnect metal extends within the trenches formed in the ILD layer 52 and includes centrally located gaps or voids extending therein as shown in FIG. 3. Such gaps may further extend into the via(s). Metal overburden is formed over the top surface of the ILD layer 52. A thermal annealing process is performed to increase the grain size of the deposited interconnect metal in the trenches. The structure 70 following thermal annealing/reflow is schematically illustrated in FIG. 4. During reflow, interconnect metal flows towards the bottom of the trenches. Interconnect metal may or may not remain on the upper sidewalls of the trenches following reflow. In embodiments including a TaN/Co barrier/liner, portions of the Co liner may be exposed following reflow of the interconnect metal. Copper grains grow to a relatively large size as a result of the reflow process and metal recrystallization. Open spaces (center upper voids) 72 extending within the trenches and bounded by the metal interconnect material are obtained following reflow. The voids can be as large as 80% of the line width in the horizontal direction and as large as 70% of the line height in the vertical direction. The maximum distance between the voids and the trench bottoms should be less than 5 nm which is smaller than the Cu grain size at the trench bottoms.

The reflow process can be performed under any conditions that cause the interconnect metal to reflow. In some embodiments including copper interconnect metal, the reflow process occurs at elevated temperatures from about 100° C. to about 450° C. for less than two hours. The time required for interconnect metal reflow depends on factors such as the temperature at which the step is conducted and the amount and type(s) of interconnect metal within the trenches. The environment employed in the reflow process could comprise a vacuum. The metal reflow is driven by capillary forces and causes substantially void-free metal interconnect metal to accumulate at the bottom portions of the trenches while voids are formed at the center upper areas of the trenches. As shown in FIG. 4, the resulting structure 70 includes trenches that are partially filled with interconnect metal. The open spaces (voids) 72 formed within the upper portions of the trenches above the top surfaces of the reflowed interconnect metal may or may not have the same dimensions. The interconnect metal may or may not adjoin the barrier/liner 58 in the upper regions of the trenches following reflow. In some embodiments, the open spaces 72 may be formed between vertically extending portions 64' of the interconnect metal as well as over the interconnect metal in the bottom regions of the trenches. In other embodiments wherein reflow causes local depletion of interconnect metal, exposed portions (not shown) of the barrier/liner 58 adjoin portions of the open spaces.

In embodiments wherein a CuMn seed layer is employed prior to depositing copper interconnect metal, manganese atoms diffuse to the surfaces of the interconnect metal adjoining the voids 72 during reflow, coating the void surfaces of the structure 70 shown in FIG. 4. The manganese-coated surfaces provide resistance to electromigration.

Figure 5:
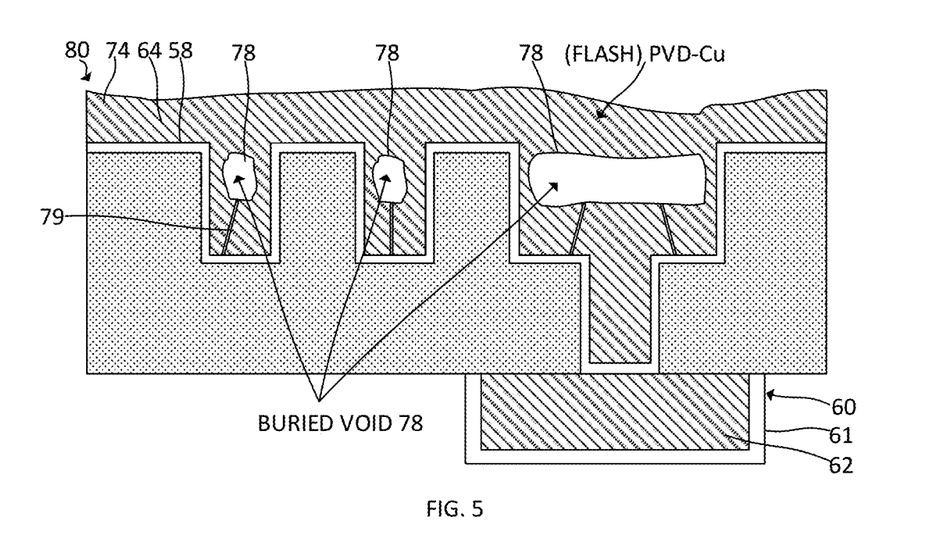
FIG. 5 is a schematic, cross-sectional view thereof following flash deposition of additional copper.
Figure 6:
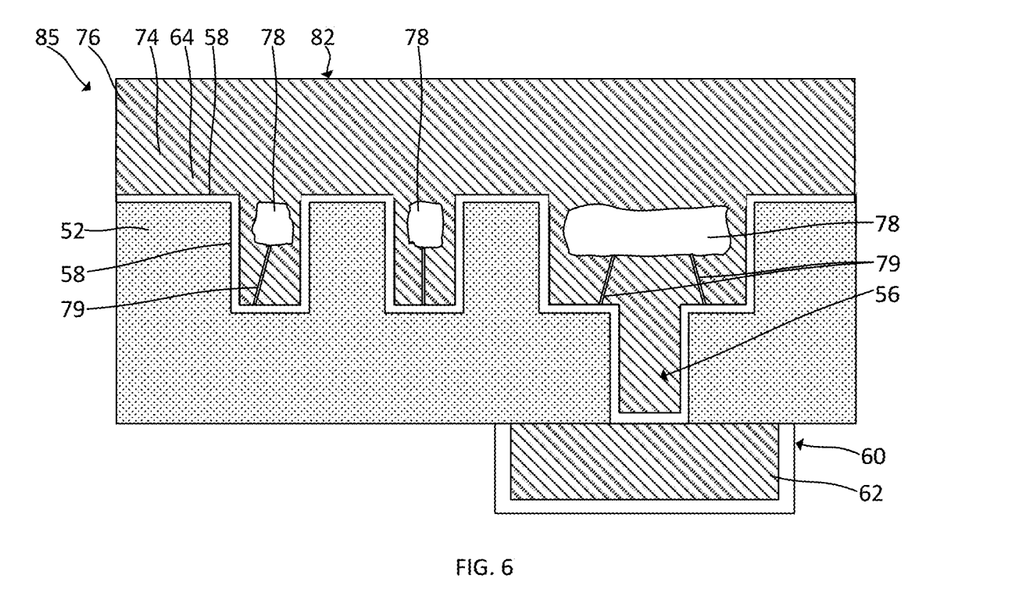
FIG. 6 is a schematic, cross-sectional view thereof following electroplating further copper on the structure.

A flash copper deposition process is employed to obtain a structure 80 as schematically illustrated in FIG. 5. A copper flash layer 74 may be formed using physical vapor deposition (PVD) in a copper sputter reactor to deposit a relatively thin copper layer, thereby closing the open spaces 72 within the trenches, forming buried voids 78, and covering exposed portions (if any) of the barrier/liner 58. The flash layer 74 may be deposited to a blanket thickness of, for example, five to twenty nanometers (5 to 20 nm), preferably ten to fifteen nanometers (10 to 15 nm) and protects the barrier/liner during subsequent electroplating of interconnect metal. (Exposed cobalt, for example, may dissolve in copper plating baths, causing reliability problems.) Deposition of interconnect metal by electroplating the metal is performed subsequent to formation of the flash layer to obtain a structure 85 as shown in FIG. 6. The newly electroplated interconnect metal layer 76 is deposited directly on the flash layer 74 and accordingly above the existing interconnect metal layers 64, 74 and the protected barrier/liner 58. The initial and subsequently deposited interconnect metal layers 64, 74, 76 form integral metal interconnect layers 82 within the trenches in the resulting structure, the reflown interconnect metal forming the bottom portions of the metal interconnect layers 82. Buried voids 78 and metal grain boundaries 79 remain in the trenches following deposition of the additional interconnect metal layers 74, 76, as shown in FIGS. 5 and 6. The grain boundaries 79 formed from the reflown metal intersect the buried voids 78. Excess metal interconnect material (overburden) deposited by electroplating extends outside the trenches and on the top surfaces of the structure following electroplating and subsequent annealing, as schematically illustrated in FIG. 6.

Figure 7:
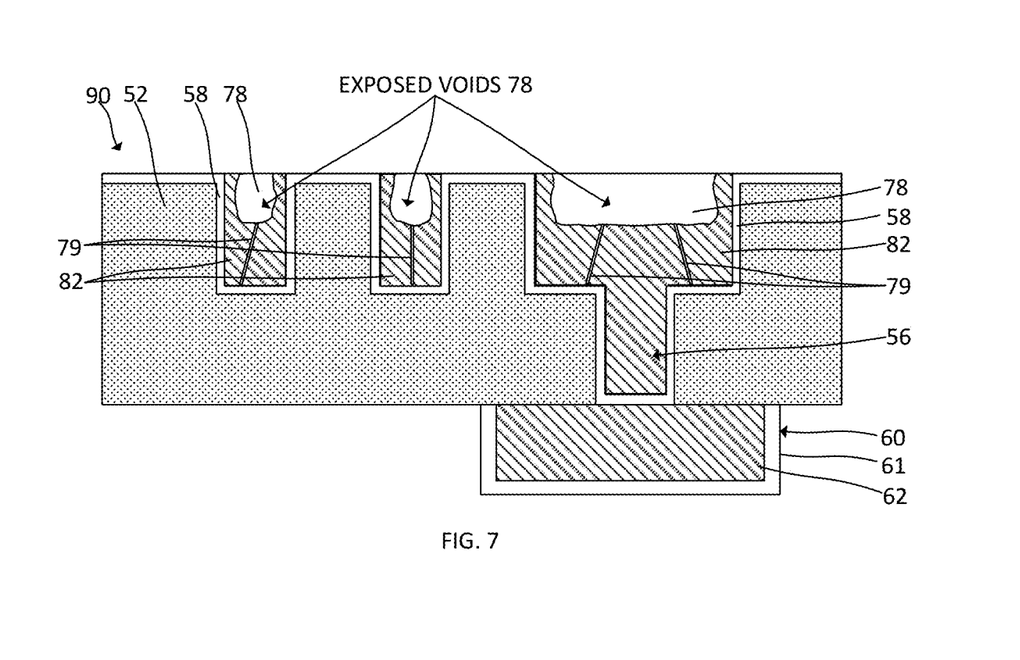
FIG. 7 is a schematic, cross-sectional view thereof following planarization of the top surface of the structure, thereby exposing voids in the copper.

A chemical mechanical planarization (CMP) process is employed to remove interconnect metal and portions of the layers forming the diffusion barrier and adhesion layer 58 from the top surface of the dielectric (ILD) layer 52. A two-stage CMP process may be employed to remove the different materials. Voids 78 formerly buried within the interconnect metal 82 are exposed following CMP, as shown in FIG. 7. The remaining interconnect metal 82 includes top surfaces that are essentially coplanar with the top surface of the ILD layer 52. Portions of the interconnect metal accordingly bound the bottom and lateral sides of the open voids 78. The interconnect structure 90 is cleaned to remove contaminants that may be introduced during CMP.

A metal or metal compound is deposited on the structure following CMP. Exemplary materials for filling the open voids 78 within the interconnect structure 90 and for forming metal capping layers include cobalt (Co), cobalt alloys such as cobalt-tungsten-phosphorus (CoWP) and cobalt-tungsten-boron (CoWB), ruthenium (Ru), molybdenum (Mo) and niobium (Nb). The metal filling the voids 78 and/or forming capping layers should have little or no solid solubility in copper (less than five percent) and further should not form a high resistivity compound with copper. The filling/capping metal(s) form copper diffusion barriers.

Cobalt (Co) may, for example, be selectively deposited using a metal-organic precursor in a CVD process at a temperature range of 150-200° C. Post-Co deposition annealing at a temperature ranging from 300° C. to 450° C. for 10 minutes to 2 hours is an optional step which flows Co into voids (cobalt reflow). CoWP and CoWB alloys, if employed, may be deposited using electroless deposition. Ruthenium may be deposited using thermal CVD at 1.5 Torr and at a process temperature of 250-350° C. The capping regions 84B of the deposited metal layer 84 preferably inhibit copper oxidation and corrosion and withstand cleaning steps that may subsequently be conducted. The capping material also reduces atomic diffusion at the cap/Cu interfaces. Deposition times are controlled to obtain a cap layer of desired thickness. The thickness of Co may, for example, be in the range of 10 nm to 30 nm. In embodiments wherein the metal fill layer 84A is Co, CMP of the Co is followed by selective Ru or Co deposition to form the capping regions 84B. A selective CVD cobalt deposition process allows formation of both the cap portions 84B and the void filler layers 84A at the same time and in the same tool if desired.

Figure 8:
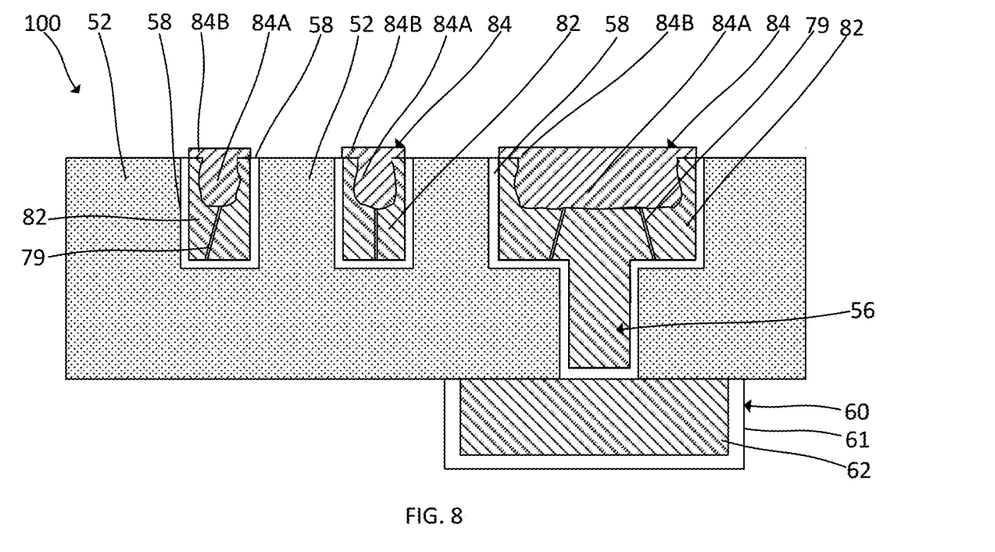
FIG. 8 is a schematic, cross-sectional view thereof following deposition of fill/cap metal within the voids in the copper.

An interconnect structure 100 as schematically illustrated in FIG. 8 may be obtained following the deposition of cobalt, a cobalt alloy, or other metals such as those discussed above. The interconnect structure 100 includes copper or copper alloy interconnect metal 82, a metal filler layer 84A filling the voids 78, and a metal capping layer 84B forming caps over the filler layer 84A and the top surfaces of the interconnect metal 82 on opposite sides of the filled voids. The filler layer 84A is the portion of the layer 84 that fills the voids and extends to the top plane of the structure 100 defined by the upper surfaces of the dielectric layer and top surfaces of the interconnect metal 82. In some embodiments, the filler layer 84A adjoins a coating of manganese atoms previously formed on surfaces of the voids 78. The capping layer 84B is the portion of the layer formed on the metal filler layer as well as the top surfaces of the interconnect metal 82, and therefore extends above the top plane of the exemplary structure 100. The filler and capping layers 84A, 84B may consist essentially of the same material and be formed using a single deposition process to obtain monolithic filler-cap structures. In embodiments where post-Co deposition reflow and CMP of the filler layer 84A are performed, Ru is preferred over Co for the capping layers 84B because of higher selectivity which leads to higher production yield in interconnect structures having fine dimensions. Deposition of the capping layer is selective in one or more embodiments such that metal is not deposited on dielectric surfaces. The caps formed by the capping layer 84B accordingly do not extend over the top surface of the ILD layer 52. Cobalt can be selectively deposited with respect to the top surface of the barrier/liner 58 by oxidizing the exposed surface of the barrier/liner (for example TaN) prior to deposition.

Figure 9:
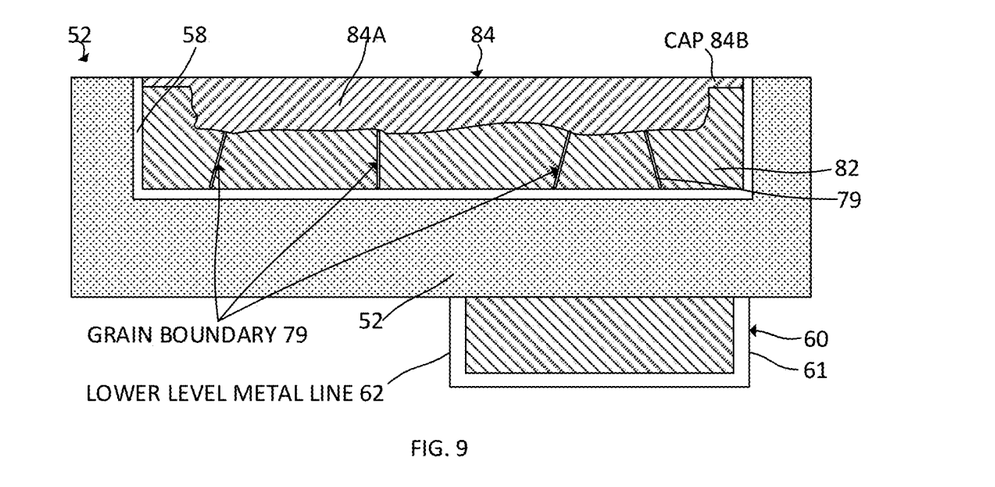
FIG. 9 is a greatly enlarged, schematic, longitudinal cross-sectional view of a portion of an interconnect structure showing grain boundaries within interconnect metal beneath a filled void.

A greatly enlarged longitudinal, cross-sectional view of a portion of an interconnect structure formed using the above-described process is shown in FIG. 9. The reference numerals employed in FIGS. 1-8 are used in FIG. 9 to designate the same or similar elements. Grain boundaries 79 formed within the reflown interconnect metal extend between the barrier/liner 58 at the bottom of the trench and the filler metal 84A, creating a "bamboo" microstructure.

Interconnect scaling can make it difficult to ensure electromigration (EM) reliability. One of the causes of poor EM performance, particularly in the sub-90 nm regime, is the polycrystalline copper structure that arises from the disturbed copper grains grown in confined areas such as the trenches described above. Copper interconnects having relatively fine dimensions, for example line widths of about five to twenty nanometers (5-20 nm), will have small copper grains and are likely to have no "bamboo" structures for long distances. In a "bamboo" microstructure, the grain boundaries appear similar to the stalk of a bamboo plant with notched segmentation as schematically illustrated in FIG. 9. Each grain boundary in the bamboo structure is isolated from each other and has no connection to other grain boundaries. The "bamboo" microstructure offers more resistance to electromigration than non-bamboo microstructures because migration of Cu atoms due to the electron wind which generally occurs along grain boundaries cannot have a continuous path in the bamboo structure. Copper grain size is enlarged by annealing at high temperatures such as during reflow. However, in confined geometries, copper grain growth is still limited and may not be sufficient to form a bamboo microstructure. Bamboo microstructures in copper lines are discussed, for example, in Pub. No. US 2009/0206484 A1 published Aug. 20, 2009, which is incorporated by reference herein.

The limited copper grain growth in the confined geometries of fine featured interconnect structures is addressed by employing the techniques discussed herein. Even if the grain growth of interconnect metal in the trenches is limited or disturbed, a bamboo microstructure is obtained locally beneath the filled voids, thereby providing relatively high electromigration reliability. As discussed above, voids are formed at the upper central areas of the trenches as schematically illustrated in the cross-sectional views. The voids do not extend to the dielectric sidewalls or barrier/liners 58, but are instead bounded by interconnect metal that lines the trenches. The center upper voids are formed during the heating process that promotes reflow of the interconnect metal 64 (e.g. elemental copper) toward the trench bottom regions, as shown in FIG. 4. The voids are then capped with flash copper 74 followed by electroplating of copper and CMP. The voids are exposed at the tops of the remaining interconnect metal, as shown in FIG. 7. These voids are filled by cobalt or other suitable electrically conductive metal or metal compound. The EM performance of the interconnect metal of the resulting interconnect structure is comparable to that of interconnect metal having a bamboo microstructure as the interconnect metal grains around the filled voids will have a bamboo structure despite the relatively limited grain size of the interconnect metal due to geometrical constraints. The locally formed microstructures beneath the metal-filled voids provide high electromigration reliability. Referring to the longitudinal cross-sectional view of a portion of an interconnect structure as shown in FIG. 9, each of the grain boundaries 79 extends from the liner 58 at the bottom surface of the trench to the filler layer 84A within the central void that extends into the interconnect metal 82. The microstructure of the region of the interconnect metal 82 beneath the filler layer 84A, which resembles bamboo, enhances electromigration reliability. The capping layer 84B includes a center portion on the filler layer 84A and laterally extending portions formed directly on the exposed top surfaces of the interconnect metal 82 on each side of the filled void.

In summary, in accordance with aspects of the invention, voids formed in interconnect metal are not a problem to be addressed, but rather part of a solution for enhancing electromigration performance in interconnect applications characterized by disturbed interconnect metal (e.g. copper) grain growth. For example, a bamboo microstructure can be obtained even when the copper grain size in an interconnect made entirely from copper would not be large enough for the grain boundary to cross the entire height of the interconnect metal. The copper grains at the trench bottoms, being enlarged by reflow and recrystallization, are large enough to form bamboo microstructures in the bottom regions of the interconnect metal that include grain boundary lines extending from the bottom surfaces of the trenches to the bottoms of the filled voids.

Following deposition of the filler/cap layer 84, the interconnect structure may be subjected to further processing steps. Additional BEOL layers may be formed if necessary to complete the interconnect structure. Interconnect structures as described herein facilitate adoption of scaled down technology nodes. The processes described herein may, if desired, employ currently existing metal deposition processes, allowing their implementation within existing facilities using existing tooling. It will be appreciated that new deposition processes having application to the processes discussed herein may be developed and adopted.

FIGS. 1-8, as discussed above, depict exemplary processing steps/stages in the fabrication of exemplary structures including metal interconnects. Although the overall fabrication method and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* $1^{st}$ Edition, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more layers of a type commonly used in integrated circuit devices or associated interconnect layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, exemplary methods are provided for reducing defects, improving electromigration reliability, and/or enhancing line yield, particularly in structures wherein confined geometries limit metal grain growth. As discussed above, interconnect structures include a dielectric layer 52 having a top surface and a plurality of open-ended trenches 54 extending within the dielectric layer. Each of the trenches has opposing sidewalls that may or may not be parallel. Trenches may, for example, have relatively wide top openings and vias may extend from one or more trenches. A structure is obtained that includes a metal interconnect layer 82 filling the trenches and including voids 78 buried therein, such as shown in FIG. 6. The metal interconnect layer includes bottom regions beneath the voids 78, the bottom regions including bamboo microstructures comprising grain boundaries 79 extending from the bottom surfaces of the trenches to the voids 79. The metal interconnect layer is planarized, thereby exposing a top surface of the dielectric layer and opening the voids 79 as schematically illustrated in FIG. 7. The opened voids are filled with an electrically conductive filler layer 84A, the electrically conductive filler layer comprising a copper diffusion barrier. Cobalt, CoWP, CoWB, ruthenium, molybdenum and niobium are among the materials that may be employed to fill the voids. A structure 85 as shown in FIG. 6 may be obtained by depositing a first metal layer 64 comprising copper within the trenches, reflowing the first metal layer to form grains having sufficient size to form the bamboo microstructure in the bottom regions of the interconnect metal, and capping the voids with a second metal layer 74 comprising copper. The method may further include electroplating a third metal layer 76 comprising copper on the second metal layer 74, the metal interconnect layer 82 comprising the first, second and third metal layers.

An interconnect structure in accordance with one or more aspects of the invention includes an open-ended trench extending within a dielectric layer 52 and downwardly with respect to the top surface of the dielectric layer, the trench being bounded by opposing sidewalls and a bottom surface. A metal interconnect comprising copper is within the trench. A liner 58 comprising a diffusion barrier layer is between the metal interconnect and the dielectric layer. A void extends within the metal interconnect 82, the void having a top opening. An electrically conductive filler layer 84A fills the void. The electrically conductive filler layer is comprised of a copper diffusion barrier. The metal interconnect 82 further includes a bottom region between the void and the bottom surface of the trench, the bottom region including a bamboo microstructure comprising grain boundaries extending from the liner to the void. The metal interconnect 82 further includes vertically extending regions between the opposing sidewalls of the trench and the filled void, as shown in FIGS. 8 and 9, it being appreciated that the trench sidewalls and therefor the liner 58 thereon may or may not extend orthogonally with respect to the top surface of the structure. The bottom region and the vertically extending regions completely separate the void from the liner. As discussed above, the liner 58 may further include an adhesion layer on the diffusion barrier layer. The interconnect structure may further include a capping layer 84B having a center portion on the electrically conductive filler layer 84A and laterally extending portions on a top surface of the metal interconnect layer 82. The electrically conductive filler layer and the capping layer may comprise an integral structure consisting essentially of the same material.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that integrated circuits including the exemplary BEOL structures discussed above can be distributed in raw form (i.e., a single wafer having multiple unpackaged chips), as bare dies, in packaged form, or incorporated as parts of intermediate products or end products that benefit from having FEOL (front-end-of-line) devices and interconnect structures formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation or orientation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating an interconnect structure, comprising:
    obtaining an initial structure comprising:
        a dielectric layer,
        a plurality of open-ended trenches extending downwardly within the dielectric layer, each of the open-ended trenches having a bottom surface and opposing sidewalls; and
        a metal interconnect layer comprising copper, the metal interconnect layer filling the open-ended trenches and including buried voids therein, the metal interconnect layer further including bottom regions beneath the buried voids, the bottom regions including bamboo microstructures comprising grain boundaries extending from the bottom surfaces of the open-ended trenches to the buried voids;
    planarizing the metal interconnect layer, thereby exposing a top surface of the dielectric layer and opening the buried voids to form opened voids; and
    filling the opened voids with an electrically conductive filler layer, the electrically conductive filler layer comprising a copper diffusion barrier.

2. The method of claim 1, wherein obtaining the initial structure includes:
    depositing a first metal layer comprising copper within the open-ended trenches;
    reflowing the first metal layer; and
    depositing a second metal layer comprising copper over the first metal layer, thereby forming the buried voids, wherein the metal interconnect layer comprises the first and second metal layers.

3. The method of claim 2, wherein obtaining the initial structure further includes:
    electroplating a third metal layer comprising copper on the second metal layer, the metal interconnect layer comprising the first, second and third metal layers.

4. The method of claim 3, wherein depositing the second metal layer comprises physical vapor deposition.

5. The method of claim 4, further including:
    depositing a capping layer on the electrically conductive filler layer and on a top surface of the metal interconnect layer, the electrically conductive filler layer and the capping layer consisting essentially of the same material.

6. The method of claim 4, wherein the electrically conductive filler layer consists essentially of cobalt.

7. The method of claim 6, wherein the metal interconnect layer consists essentially of copper.

8. The method of claim 1, wherein the metal interconnect layer consists essentially of copper.

9. The method of claim 1, wherein one or more of the open-ended trenches has an average width between five and twenty nanometers.

10. The method of claim 1, further including forming a coating of manganese atoms on a surface of the metal interconnect layer adjoining the buried voids.

11. The method of claim 1, wherein filling the opened voids includes depositing cobalt using chemical vapor deposition.

12. The method of claim 1, wherein filling the opened voids includes depositing CoWP or CoWB using electroless deposition.

13. An interconnect structure, comprising:
    a dielectric layer having a top surface;
    an open-ended trench extending within the dielectric layer and downwardly with respect to the top surface, the trench being bounded by opposing sidewalls and a bottom surface;
    a metal interconnect comprising copper within the trench;
    a liner comprising a diffusion barrier layer between the metal interconnect and the dielectric layer;
    a void extending within the metal interconnect, the void having a top opening; and
    an electrically conductive filler layer filling the void, the electrically conductive filler layer comprising a copper diffusion barrier;
    wherein the metal interconnect further includes:
        a bottom region between the void and the bottom surface of the trench, the bottom region including a bamboo microstructure comprising grain boundaries extending from the liner to the void; and
        vertically extending regions between the opposing sidewalls of the trench and the void, the bottom region and the vertically extending regions completely separating the void from the liner.

14. The interconnect structure of claim 13, wherein the liner further includes an adhesion layer on the diffusion barrier layer.

15. The interconnect structure of claim 13, further including a capping layer having a center portion on the electrically conductive filler layer and laterally extending portions on a top surface of the metal interconnect layer, the electrically conductive filler layer and the capping layer comprising an integral structure consisting essentially of the same material.

16. The interconnect structure of claim 13, wherein the metal interconnect layer consists essentially of copper.

17. The interconnect structure of claim 16, wherein the electrically conductive filler layer is selected from the group consisting of cobalt, CoWP, CoWB, ruthenium, molybdenum and niobium.

18. The interconnect structure of claim 17, further including a capping layer having a center portion on the electrically conductive filler layer and laterally extending portions on a top surface of the metal interconnect layer, the electrically conductive filler layer and the capping layer comprising an integral structure consisting essentially of the same material.

19. The interconnect structure of claim 16, wherein the electrically conductive filler layer consists essentially of cobalt.

20. The interconnect structure of claim 13, further including a coating of manganese atoms between the metal interconnect layer and the electrically conductive filler layer.

* * * * *